United States Patent [19]

Pribble

[11] Patent Number: 5,734,189
[45] Date of Patent: Mar. 31, 1998

[54] LOW PARASITIC SOURCE INDUCTANCE FIELD-EFFECT TRANSISTOR DEVICE HAVING VIA CONNECTIONS DISPOSED ALONG AN OUTER PERIPHERY THEREOF

[75] Inventor: William Leland Pribble, Salem, Va.

[73] Assignee: ITT Industries, Inc., White Plains, N.Y.

[21] Appl. No.: 762,312

[22] Filed: Dec. 9, 1996

[51] Int. Cl.$^6$ ................................................ H01L 27/78
[52] U.S. Cl. ...................... 257/401; 257/207; 257/287; 257/276
[58] Field of Search .............................. 257/207, 276, 257/270, 287, 401

[56] References Cited

U.S. PATENT DOCUMENTS

| | | |
|---|---|---|
| 4,870,478 | 9/1989 | Weitzel et al. .......................... 257/276 |
| 5,023,677 | 6/1991 | Truitt .......................................... 257/276 |
| 5,283,452 | 2/1994 | Shih et al. ................................. 257/276 |
| 5,324,981 | 6/1994 | Kobiki et al. ............................. 257/276 |
| 5,438,212 | 8/1995 | Okaniwa ................................... 257/276 |

*Primary Examiner*—Tom Thomas
*Assistant Examiner*—David B. Hardy
*Attorney, Agent, or Firm*—Plevy & Associates

[57] ABSTRACT

An FET device is disclosed of the type typically fabricated on a substrate and including an active FET region, an input port, an output port, a common connection and via ground connections for coupling the common connection to a ground. The improvement includes the via connections being disposed on an outer periphery that bounds the active FET region which reduces the distance between the common connection and ground, and thereby reduces the associated common lead inductance.

16 Claims, 2 Drawing Sheets

LOW PARASITIC SOURCE INDUCTANCE FIELD-EFFECT TRANSISTOR DEVICE HAVING VIA CONNECTIONS DISPOSED ALONG AN OUTER PERIPHERY THEREOF

BACKGROUND OF THE INVENTION

The present invention relates generally to Field-Effect Transistors, and more particularly to a Field-Effect Transistor having a significantly lower common lead inductance when utilized as a two port active device.

DESCRIPTION OF THE PRIOR ART

A Field-Effect Transistor (FET) is a type of semiconductor device which is utilized in a wide variety of electronic circuit applications. FET devices typically have three leads including a drain lead, a source lead and a gate lead. Disposed between the drain and source is a channel, which is the portion of the FET that actually conducts current when the device is turned on. The gate is the control input of the device, which is utilized to control the current flow in the channel.

In various circuit applications, FET devices are often utilized as two port active devices. In a two port configuration, two out of the three FET leads serve as the input and output ports. While the third FET lead is utilized as the common connection, which is connected to the ground potential of the circuit. Depending on the particular two port configuration, any one of three FET leads can be utilized as either the input port, output port or common connection.

Two fundamental limitations in the performance of two port active devices in any circuit are the gain-bandwidth product and feedback from the output to input ports. The gain-bandwidth product bounds the reflective match achievable for a particular reactive load and is determined by the parasitic capacitive and inductive reactance of the device.

One significant parasitic element of an FET device is the common lead inductance. The common lead inductance is the inductance associated with the common connection of the FET device which is a three terminal device configured in a two port configuration. The common lead inductance is influenced by optimizing the physical location of the three FET leads. This particular parasitic inductance also exacerbates the input matching problem by increasing the reactive impedance at the input of the FET. The common lead inductance further effects the two port FET circuit by providing a feedback path from the output to the input port which significantly reduces the maximum available gain of the circuit. The feedback path is created since this inductance is associated with the common connection of the circuit.

Significantly reducing the common lead inductive effect would provide a number of advantages in two port FET devices. First of all, both the maximum available gain and gain-bandwidth product would be significantly increased. Further, reducing this inductance would facilitate the scaling of FET devices to larger sizes through a reduction in parasitic reactance.

The performance of two port active devices are further constrained by the utilization of non-ideal matching elements. Examples of this non-ideal behavior include any loss associated with reactive elements and distributed circuit effects present when element dimensions are any appreciable portion of the wavelength at the operating frequency, which is usually greater than one eighth of a wavelength. These distributed effects are particularly important in Monolithic Microwave Integrated Circuits (MMIC) where all the matching elements utilized exceed the one eighth wavelength guideline.

The MMIC realization of an inductor which is utilized to resonate out the FET parasitic capacitances is increasingly non-ideal with larger required values of inductive reactance. For a given resonate frequency, smaller FET capacitance levels require larger inductors in the matching circuitry. Matching larger capacitance levels in order to keep the inductors in the matching circuit small and to cover a greater bandwidth, implies utilizing a larger unit cell FET. This "scaling" up of the unit cell FET is limited by the previously discussed common lead inductance. Therefore, reducing the common lead inductance along with the FET unit cell design to maximize the matching circuit gain-bandwidth product, offer significant improvement in performance in the two port FET device.

It is therefore, an object of the present invention to provide an improved Field Effect Transistor that has a significantly lower common lead inductance when utilized as a two port active device.

SUMMARY OF THE INVENTION

An FET device is disclosed of the type typically fabricated on a substrate and including an active FET region, an input port, an output port, a common connection and via ground connections for coupling the common connection to a ground. The improvement includes the via connections being disposed on an outer periphery that bounds the active FET region which reduces the distance between the common connection and ground, and thereby reduces the associated common lead inductance.

It is further disclosed that a layer of dielectric material is disposed on the via connections.

BRIEF DESCRIPTION OF THE DRAWING

The above objects, further features and advantages of the present invention are described in detail below in conjunction with the drawings, of which.

DETAILED DESCRIPTION OF THE DRAWING

The present invention is directed to an improved FET layout which makes it particularly suitable to be utilized in a two port circuit configuration. The FET according to the present invention is specially suited for such an application because it has a significantly reduced common lead inductance, which reduces undesirable feedback and also enables the selection of the appropriate size FET unit cell. The reduction of the common lead inductance is achieved by laying out the FET device so that the common lead connection is as close as possible to the active region of the FET.

As previously described, FET devices are often utilized as a two port active device. In a two port configuration, two out of three leads of the FET serve as the input and output ports.

The third FET lead is utilized as the common connection, which is connected to the ground potential of the circuit. Depending on the particular two port configuration, any one of three FET leads can be utilized as either the input port, output port or common connection. These three different configurations of FET two port devices are known as a common source, a common base and a common drain.

Figure 1:
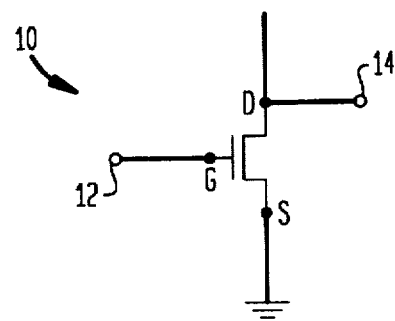
FIG. 1 is a schematic of a common source FET configuration.

A schematic of a common source FET configuration is shown in FIG. 1. In the common source configuration 10, the gate serves as the input port 12, while the drain serves as the output port 14. The source serves as the common connection in this circuit 10 since it is the FET lead which is grounded as shown in FIG. 1.

Figure 2:
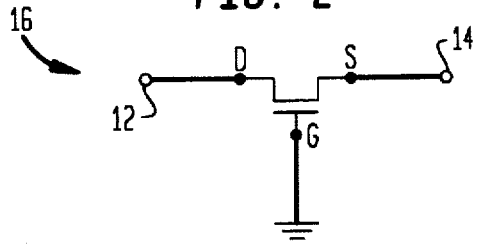
FIG. 2 is a schematic of a common gate FET configuration.

A schematic of a common gate FET configuration is shown in FIG. 2. In the common gate configuration 16, the drain serves as the input port 12, while the source serves as the output port 14. The gate serves as the common connection in this circuit 16 since it is the FET lead which is grounded as shown in FIG. 2.

Figure 3:
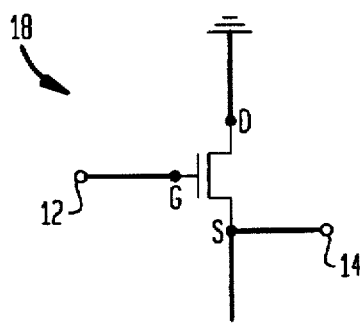
FIG. 3 is a schematic of a common drain FET configuration.

A schematic of a common drain FET configuration is shown in FIG. 3. In the common drain configuration 18, the gate serves as the input port 12, while the source serves as the output port 14. The drain serves as the common connection in this circuit 18 since it is the FET lead which is grounded as shown in FIG. 3.

Figure 4:
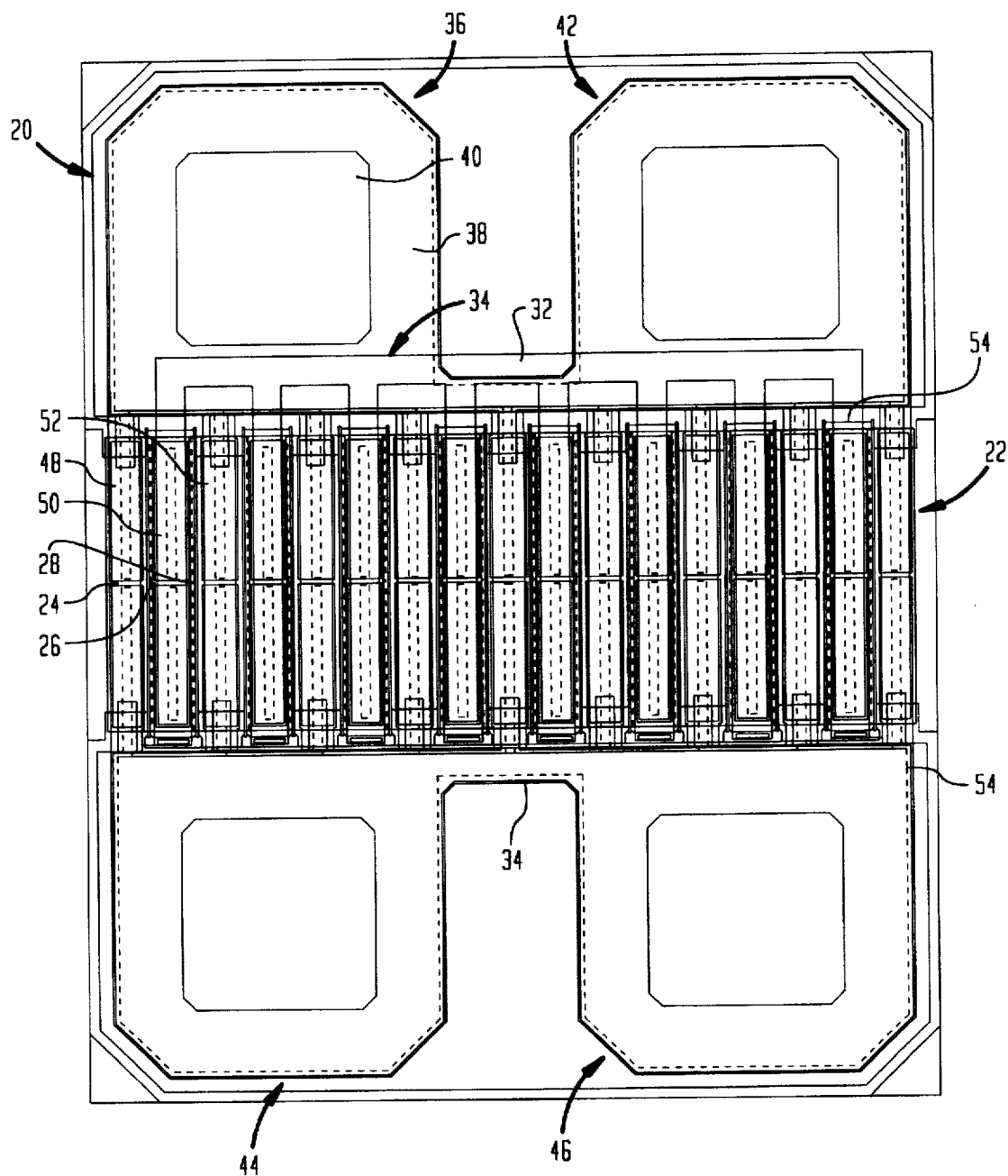
FIG. 4 is a top view of the layout for the FET device according to the present invention.

Referring to FIG. 4, there is shown is a top view of the layout for the FET device according to the present invention. The FET device 20 employs a multi-layer circuit approach which is adaptable to be disposed within a semiconductor substrate (not shown). The FET device 20 includes an active FET region 22 and a number of via ground connections 36,42,44,46. The active FET region 22 is the portion of the device that includes the drain, gate and source leads. While the via ground connections 36,42,44,46 provide the path to connect the common lead to a ground plane (not shown) on the lower surface of the substrate.

The active FET region 22 includes a predetermined number of drain fingers 24, gate fingers 26 and source fingers 28 which are disposed in the substrate (not shown) in a substantially parallel configuration. The active FET region 22 being configured in such a configuration is well known in the art. As can be seen in FIG. 4, The FET fingers 24, 26,28 are only partially visible through the layers which are disposed above. The drain, gate and source fingers 24, 26, 28 are arranged in such a configuration in order to enable all the drain fingers 24, gate fingers 26 and source fingers 28 to be separately coupled together to form a single unit cell FET.

The gate fingers 24 are commonly coupled together by a bus 34. While the source fingers 28 are commonly coupled together by another bus (not shown) which is disposed beneath the layers shown in FIG. 4. The drain fingers 24 are commonly coupled by each one being connected to one of the via connections 36,42,44,46. The FET fingers 24,26,28 also have disposed above, layers of conducting material 48,50,52 which serves as electrical contacts. The contacts 48,50,52 enable electrical power and signals to be applied to the FET fingers 24,26,28 during operation of the device 20. Further, in the case of the drain fingers 24, the contacts 48 also serve to connect each drain finger 24 to the respective via connection 36,42,44,46.

As previously described, the via connections 36,42,44,46 provide the path to connect the common lead to a ground plane (not shown) on the lower surface of the substrate. The via connections 36,42,44,46 each consist of an outer portion 38 and inner portion 40. The outer portion 38 consists of a layer of conducting material disposed over the substrate, while the inner portion 40 consists of conducting material which extends through a via hole in the substrate (not shown). The outer and inner portions 38,40 are integrally formed in order to provide the electrical connection between the ground plane not shown) and drain fingers 24.

In the present invention, the common lead connection of the FET device 20 is located as close as possible to the active FET region 22. This is accomplished by laying out the FET device 20 so that the via connections 36,42,44,46 are located on the outer periphery 54 of the active FET region 22. Placing the via connections 36,42,44,46 in this location provides ground connections that are as close as possible to all points along the common lead fingers 24 as shown and thus significantly reduces he associated parasitic inductance.

Further, the input port 32 which is coupled to the commonly connected gate fingers 26 and the output port 34 which is coupled to the commonly connected source fingers 28 are both located near the outer periphery 54 of the active FET region 22 as shown. The output port 32 is formed by the portion of the bus 32 located between the via contacts 36,42. While the input port 34 is formed by the portion of the other bus (not shown) located between the via connections 44,46.

Since the configuration shown in FIG. 4 is a common drain configuration, the drain fingers 24 are the common lead and thus is coupled to ground, while The gate fingers 26 are coupled to the input port 32 and the drain fingers 28 are coupled to the output port 34. However, it should be noted that the present invention is not limited to any particular two port configuration. A common source or gate configuration also can be implemented by utilizing the above described layout. All that is necessary to implement the other configurations is to change the interconnection between the PET fingers 24,26,28.

Figure 5:
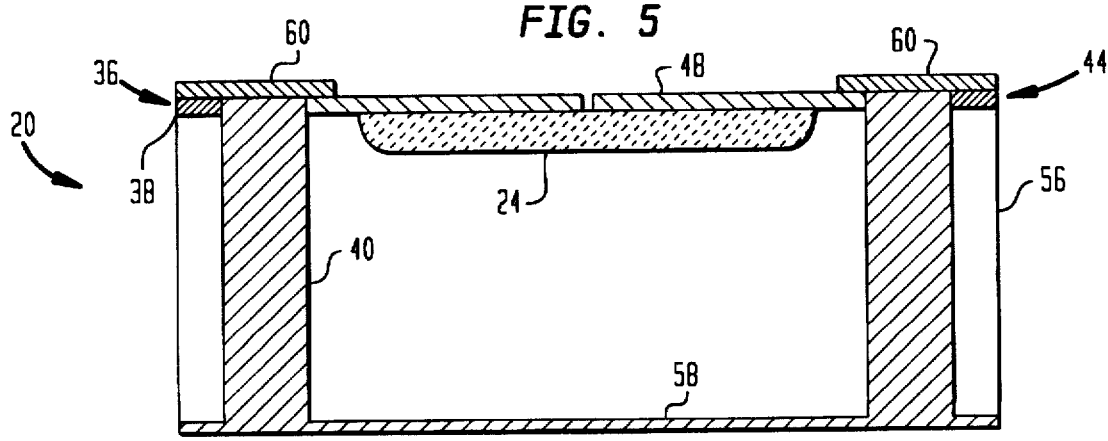
FIG. 5 is a cross sectional view of the FET device according to the present invention.

Referring to FIG. 5, a cross sectional view of the FET device according to the present invention is shown. As is evident from this figure, the drain fingers 24 are disposed within the substrate 56 as previously described. Further, the contact 48 is shown disposed over the respective drain finger 24. This figure also shows via connections 36,44 providing the path to connect the drain fingers to the ground plane 58 on the lower surface of the substrate 56. The via connections each consist of an outer portion 38 and inner portion 40. The outer portion 38 is disposed over the substrate 56, while the inner portion 40 extends through a via hole in the substrate 56 to the ground plane 58.

The present invention also includes a layer of dielectric material 60 disposed over the via connections 36,44. The dielectric material 60 utilized has both a low permitivity and a low resistive loss that covers these ground connections 36,44 and thus enables the matching circuit utilized to be connected to the FET cell creating a multi-level circuit. Such a concept is adaptable to any size unit FET cell with a resulting negligible source inductance and thus facilitates the scaling of the unit cell to any size required for the optimum resonant inductor.

Additional circuit advantages realized from the present invention is a significant reduction in overall circuit size due to the improved aspect ratio of the larger unit cells as opposed to the combination of a greater number of smaller unit cells. Also, the circuit gain and stability is improved due to the lower source inductance.

The previously described multi-level circuit approach 20 enables the FET common lead inductance to be significantly reduced in order to improve the performance in any one of the two port FET configurations including common source, common gate and common drain. The low induction allows FET unit cell selection to be based on optimum resonant inductor sizing for maximum bandwidth when non-ideal matching elements are required, such as with MMICs. The maximum unit cell size no longer is limited by increasing the common lead inductance. Further, additional benefits of the FET according to the present invention include reduced circuit size and improved stability.

While the invention has been particularly shown and described with reference to preferred embodiments thereof, it will be understood by those skilled in the art that changes in form and details may be made therein without departing from the spirit and scope of the present invention.

What is claimed is:

1. An FET device of the type typically fabricated on a substrate and including an active FET region, an input port, an output port, a common connection and ground connections for coupling said common connection to a ground, wherein the improvement therewith comprising:

said via connections disposed on an outer periphery that bounds said active FET region for reducing the distance between said common connection and said ground, thereby substantially reducing the associated common lead inductance;

wherein said input port is disposed between a first pair of said via connections and said output port is disposed between a second pair of said via connections, said first pair of via connections being disposed opposite to said second pair of via connections.

2. The device of claim 1, wherein said ground is a ground plane disposed on a lower surface of said substrate.

3. The device of claim 1, wherein said via connections each include an outer portion disposed on said substrate and an inner portion extending through a hole in said substrate.

4. The device of claim 1, wherein said active FET region includes a predetermined number of drain, gate and source fingers disposed within said substrate.

5. The device of claim 4, wherein said drain fingers, said gate fingers and source fingers are separately coupled together to form a single unit cell FET.

6. The device of claim 5, wherein said input port is coupled to an FET lead selected from the group consisting of said drain fingers, said gate fingers and said source fingers.

7. The device of claim 5, wherein said output port is coupled to an FET lead selected from the group consisting of said drain fingers, said gate fingers and said source fingers.

8. The device of claim 1, which further includes a layer of dielectric material disposed over said via connections.

9. An FET device having an input port, an output port and a common connection, comprising:

an active FET region bounded by an outer periphery; and via connections disposed on said outer periphery for reducing the distance between said common connection and said ground, thereby reducing the associated common lead inductance;

wherein said input port is disposed between a first pair of said via connections and said output port is disposed between a second pair of said via connections, said first pair of via connections being disposed opposite to said second pair of via connections.

10. The device of claim 9, which further includes a substrate, said ground is a ground plane disposed on a lower surface of said substrate.

11. The device of claim 10, wherein said via connections each include an outer portion disposed on said substrate and an inner portion extending through a hole in said substrate.

12. The device of claim 10, wherein said active FET region includes a predetermined number of drain, gate and source fingers disposed within said substrate.

13. The device of claim 12, wherein said drain fingers, said gate fingers and source fingers are separately coupled together to form a single unit cell FET.

14. The device of claim 13, wherein said input port is coupled to an FET lead selected from the group consisting of said drain fingers, said gate fingers and said source fingers.

15. The device of claim 13, wherein said output port is coupled to an FET lead selected from the group consisting of said drain fingers, said gate fingers and said source fingers.

16. The device of claim 9, which further includes a layer of dielectric material disposed over said via connections.

* * * * *